(12) United States Patent
Yamamoto

(10) Patent No.: US 10,300,577 B2
(45) Date of Patent: May 28, 2019

(54) POLISHING HEAD, CMP APPARATUS INCLUDING A POLISHING HEAD, AND MANUFACTURING METHOD OF SEMICONDUCTOR INTEGRATED CIRCUIT DEVICE USING A CMP APPARATUS

(71) Applicant: SII Semiconductor Corporation, Chiba-shi, Chiba (JP)

(72) Inventor: Sukehiro Yamamoto, Chiba (JP)

(73) Assignee: ABLIC INC. (JP)

( * ) Notice: Subject to any disclaimer, the term of this patent is extended or adjusted under 35 U.S.C. 154(b) by 102 days.

(21) Appl. No.: 15/670,504

(22) Filed: Aug. 7, 2017

(65) Prior Publication Data
US 2018/0043496 A1 Feb. 15, 2018

(30) Foreign Application Priority Data
Aug. 10, 2016 (JP) ................. 2016-157371

(51) Int. Cl.
| | |
|---|---|
| *B24B 37/04* | (2012.01) |
| *B24B 37/005* | (2012.01) |
| *B24B 49/00* | (2012.01) |
| *B24B 49/10* | (2006.01) |
| *H01L 21/304* | (2006.01) |
| *B24B 37/30* | (2012.01) |

(52) U.S. Cl.
CPC .......... *B24B 37/042* (2013.01); *B24B 37/005* (2013.01); *B24B 37/30* (2013.01); *B24B 49/006* (2013.01); *B24B 49/10* (2013.01); *H01L 21/304* (2013.01)

(58) Field of Classification Search
CPC ..... B24B 37/042; B24B 37/005; B24B 37/30; B24B 49/006; B24B 49/10; H01L 21/304
USPC ........................................... 451/57, 285–290
See application file for complete search history.

(56) References Cited

U.S. PATENT DOCUMENTS

| | | | | |
|---|---|---|---|---|
| 4,910,060 | A * | 3/1990 | Nakanishi ............... | B29C 65/02 428/447 |
| 5,643,053 | A * | 7/1997 | Shendon ............... | B24B 37/042 451/28 |
| 5,876,272 | A * | 3/1999 | Inaba ...................... | B24B 37/30 257/E21.237 |
| 2002/0072316 | A1* | 6/2002 | Kim ........................ | B24B 45/00 451/343 |
| 2002/0132559 | A1* | 9/2002 | Togawa .................. | B24B 37/30 451/8 |
| 2003/0045205 | A1* | 3/2003 | Herb .................... | B24B 37/0053 451/5 |
| 2004/0152400 | A1* | 8/2004 | Homma .................. | B24B 37/30 451/57 |
| 2005/0028931 | A1* | 2/2005 | Fukaya ................... | B24B 37/30 156/345.12 |

(Continued)

FOREIGN PATENT DOCUMENTS

| | | |
|---|---|---|
| JP | 2005268566 | 9/2005 |
| JP | 2007005463 | 1/2007 |

*Primary Examiner* — George B Nguyen
(74) *Attorney, Agent, or Firm* — Adams & Wilks

(57) ABSTRACT

In a polishing head for a CMP apparatus, a stress distributing plate made of metal or ceramic is placed between a wafer on a polishing pad and an air bag configured to press down the wafer, and a shock absorbing sheet is provided between the stress distributing plate and the underlying wafer, to thereby make pressure applied from the air bag to the wafer uniform.

14 Claims, 6 Drawing Sheets

(56) References Cited

U.S. PATENT DOCUMENTS

| | | | |
|---|---|---|---|
| 2005/0208880 A1 | 9/2005 | Saito et al. ..................... | 451/11 |
| 2007/0111637 A1* | 5/2007 | Togawa .................. | B24B 37/30 |
| | | | 451/1 |
| 2012/0264354 A1* | 10/2012 | Liao .................. | H01L 21/67259 |
| | | | 451/6 |
| 2015/0308886 A1* | 10/2015 | Shinozaki ............ | G01G 21/286 |
| | | | 177/180 |

* cited by examiner

POLISHING HEAD, CMP APPARATUS INCLUDING A POLISHING HEAD, AND MANUFACTURING METHOD OF SEMICONDUCTOR INTEGRATED CIRCUIT DEVICE USING A CMP APPARATUS

BACKGROUND OF THE INVENTION

1. Field of the Invention

The present invention relates to a structure of a polishing head for a CMP apparatus configured to planarize a wafer plane uniformly throughout the wafer plane, a CMP apparatus including the polishing head, and a manufacturing method of a semiconductor integrated circuit device using the CMP apparatus.

2. Description of the Related Art

In recent years, new microfabrication technologies have been developed as the level of integration and performance of semiconductor integrated circuits (hereinafter referred to as LSIs) has increased. Chemical mechanical polishing (hereinafter also referred to as CMP with the initials of each word) is one of the new technologies, and is used frequently in LSI manufacturing processes, in particular, in the processes such as planarization of an interlayer insulating film, formation of a metal plug, and formation of embedded wiring of a multi-layer wiring forming process.

The basic structure of CMP apparatus includes a rotating platen to which a polishing pad is stuck, a wafer holding head, and a slurry feeding nozzle, and a pad refreshing device (a conditioner) is further included. Not all of CMP apparatus have a single rotating platen to which a polishing pad is stuck, and some CMP apparatus have a mechanism that is made up of a plurality of rotary and revolutionary platens. Some other CMP apparatus employs the opposite configuration, which has a plurality of heads for a single pad.

Parameters for controlling CMP apparatus include, other than the method of polishing, polishing load, the rotation speed of the platen, the rotation speed of the head, the method of selecting and feeding slurry, the conditions and frequency of conditioning, and the like.

One way to control CMP apparatus is pressurizing an air bag in a head portion to which a wafer is fixed as illustrated in FIG. 8 (see, for example, Japanese Patent Application Laid-open No. 2005-268566).

In a variation of this method, the uniformity of polishing is improved through partial pressurization by dividing a wafer region into small partitions and pressurizing the air bag for each partition separately (see, for example, Japanese Patent Application Laid-open No. 2007-005463).

The head structure disclosed in Japanese Patent Application Laid-open No. 2005-268566 in which a wafer is fixed through pressurization with the use of an air bag is explained below. Specifically, the pressure from the pressurized air bag is locally high along a peripheral portion of the air bag, and an wafer region that is in contact with that portion is pressed to the polishing pad more firmly than other wafer regions, resulting in more polishing of the target insulating material than in other wafer regions. Too much polishing of the target insulating material in some region of the wafer varies the uniformity of the polishing throughout the wafer plane, and accordingly fluctuation of the film thickness of the insulating material takes place throughout the wafer plane. Fluctuation in electrical characteristics takes place in wafer regions where the fluctuation of the film thickness took place, which may cause anomaly in electrical characteristics.

FIG. 9 is a schematic diagram of the fluctuations in film thickness. The upper part of FIG. 9 is a schematic sectional view, the middle part of FIG. 9 is a schematic plan view, and the lower part of FIG. 9 is a graph for showing the polishing rate (solid line) and the thickness of the film remaining after the polishing (dotted line). As illustrated in FIG. 9, in prior art, compressed air is introduced in order to press down a wafer 1, and high pressure higher than pressure in a central portion of the air bag applies locally to a region 6 in a peripheral portion of the air bag. In the portion of the wafer 1 that is pressed down from above by the high pressure portion, the rate of insulating film polishing rises in a high pressurization region X, where the pressure is intense, and more insulating film is polished off than in the central portion where the wafer 1 is pressed under less pressure. This lowers the in-plane uniformity in the high pressurization region X of the wafer 1 after the planarizing of the insulating film material.

A head structure that employs the partial pressurization method disclosed in Japanese Patent Application Laid-open No. 2007-005463, where a wafer region is divided into small partitions and the air bag is pressurized for each partition separately, has many regulator devices in order to apply the pressure from air separately. The head structure consequently makes the CMP apparatus large in scale and requires a complicate control mechanism.

SUMMARY OF THE INVENTION

The present invention has been made in view of the circumstances described above to provide a polishing head that has the uniformity of polishing with a simple configuration, a CMP apparatus including the polishing head, and a semiconductor integrated circuit device manufacturing method using the CMP apparatus.

The present invention uses the measures given below. Specifically, a head of the CMP apparatus has the following features in order to uniformly distribute stress applied from an air bag of the head to a wafer that is a polishing target member:

1. A stress distributing plate made of metal or ceramic is placed under the air bag, and a shock absorbing sheet is provided between the stress distributing plate and the wafer below the stress distributing plate.

2. The stress distributing plate is a layered member.

3. A surface of the stress distributing plate has a spherical shape.

A structure that presses down the wafer uniformly throughout the entire wafer plane is obtained by using the measures described above alone or in combination.

With the use of the measures described above, stress is transmitted from uniformly applied pressure to the head portion, which is configured to press down a wafer, through the air bag, the stress distributing plate, and the shock absorbing sheets, thereby enabling the head portion to press down the wafer uniformly throughout the entire wafer plane. The resultant polishing head, CMP apparatus including the polishing head, and semiconductor integrated circuit device manufacturing method that using the CMP apparatus are thus reduced in the thickness fluctuations of the wafer's polishing target material throughout the wafer plane.

DESCRIPTION OF THE EMBODIMENTS

Modes for carrying out the present invention are described below through embodiments with reference to the drawings.

Figure 1:
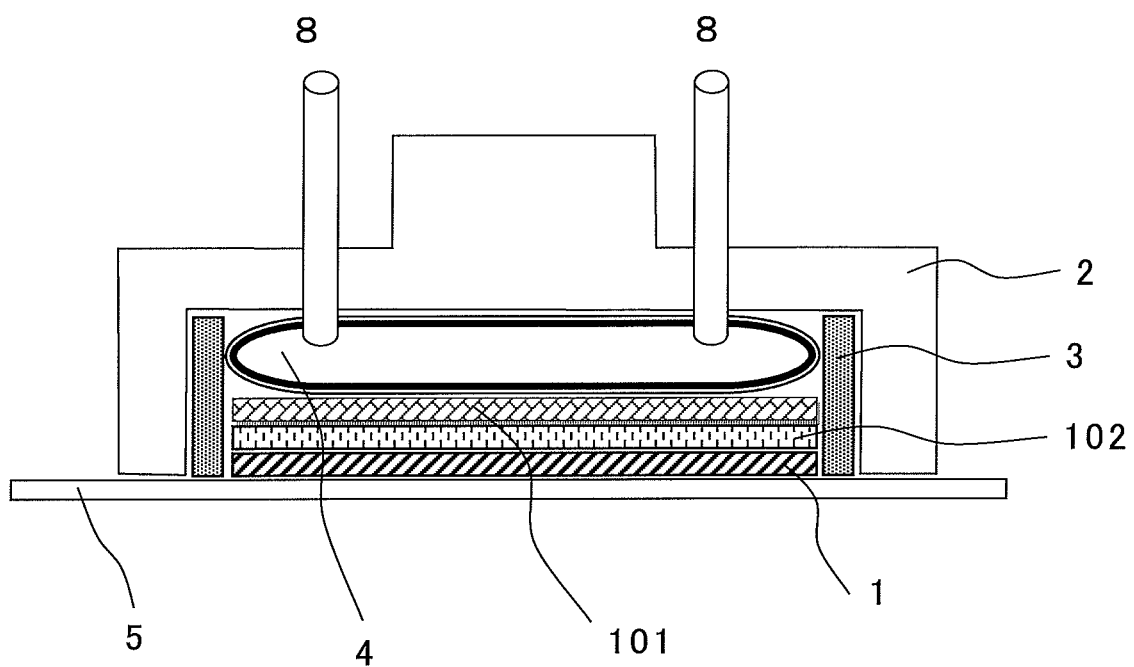
FIG. 1 is a schematic sectional view of a polishing head of a CMP apparatus according to a first embodiment of the present invention.

FIG. 1 is a schematic sectional view of a first embodiment of the present invention for schematically illustrating, in particular, the sectional structure of a head portion of a CMP apparatus. As described above, in prior art illustrated in FIG. 9, when compressed air is introduced to the air bag, the high air pressure higher than the pressure in the central portion is applied locally to the region 6 in the peripheral portion of the air bag. In the portion of the wafer 1 that is pressed down from above by the high pressure portion 6, the rate of polishing a polishing target material (for example, insulating film) rises in the region, where the pressure is intense, and more polishing target material is polished off than in the central portion where the wafer 1 is pressed under less pressure. The in-plane uniformity of the polishing target material located in the region 6 in the wafer 1 after the planarizing is consequently poor.

In the CMP apparatus of FIG. 1, an air bag 4 is placed on a back surface of a wafer 1, which is put face down on a polishing pad 5 and which has many semiconductor integrated circuit devices formed on its front surface, and the wafer 1 is fixed in place by feeding compressed air fed into the air bag 4 and pressing down on the wafer 1 from above. A retainer ring 3 is arranged so as to surround the wafer 1 and the air bag 4 from the sides, and a top ring 2 is arranged so as to envelop the wafer 1, the air bag 4, and the retainer ring 3. A polishing pad 5 is placed under the wafer 1 to polish and planarize a polishing target material (for example, insulating film) on the front surface of the wafer 1 while the top ring 2 along with the wafer 1 rotates on the polishing pad 5.

A stress distributing plate 101 and a shock absorbing sheet 102 (for example, gelatinous sheet) are further provided as illustrated in FIG. 1 to complete a structure that presses down the wafer 1. The stress distributing plate 101 placed under the airbag 4 is made of a single metal or ceramic material, or composite metal or ceramic materials, and has a plate-like shape. The shock absorbing sheet 102 is placed under the stress distributing plate 101. The stress distributing plate 101 is fabricated under optimum conditions that are devised to give the stress distributing plate 101 a hardness enough to bear the pressure from the air bag 4 and a uniform thickness. The stress distributing plate 101 is thus capable of bearing the pressure (or stress) from the air bag 4, and uniformly transmitting the pressure to components below the stress distributing plate 101.

Placing the shock absorbing sheet 102 under the stress distributing plate 101 enables the CMP apparatus to transmit pressure uniformly throughout the entire wafer plane while easing the shock of the pressure transmitted to the wafer 1. The stress distributing plate 101 and the shock absorbing sheet 102 desirably have the same shape in plan view, and the shape in plan view is larger than the wafer 1.

The airbag 4 is a bag made of a flexible material, for example, rubber, and filled with compressed air, and is low in Young's modulus. In contrast, the Young's modulus of metal or ceramic that is used for the stress distributing plate 101 provided under the air bag 4 is much higher than the Young's modulus of the air bag 4: approximately 120 GPa in the case of copper, approximately 330 GPa in the case of molybdenum, approximately 400 GPa in the case of tungsten, approximately 600 GPa in the case of silicon carbide, and approximately 550 GPa in the case of tungsten carbide.

Pressure locally applied from the air bag 4 is accordingly distributed in the horizontal direction, instead of the vertical direction, and the stress distributing plate 101 is distorted uniformly instead of locally. Stress caused by the distortion of the stress distributing plate 101 is transmitted to the wafer 1 via the shock absorbing sheet 102, which is provided under the stress distributing plate 101. The wafer 1 is polished in this manner, while avoiding a situation in which locally applied pressure makes the polishing rate extremely high in the wafer's peripheral portion.

In the case where the stress distributing plate 101 is a layered member made of composite materials, a material low in Young's modulus is desirably placed on the air bag side while a material high in Young's modulus is placed on the shock absorbing sheet side. For example, when a layered member having an aluminum layer that is approximately 70 GPa in Young's modulus and a tungsten layer that is approximately 400 GPa in Young's modulus is used as the stress distributing plate 101, the aluminum layer is desirably placed so as to be in contact with the air bag 4. This configuration facilitates the distribution of local pressure, and advances the uniformity of polishing further.

Figure 2:
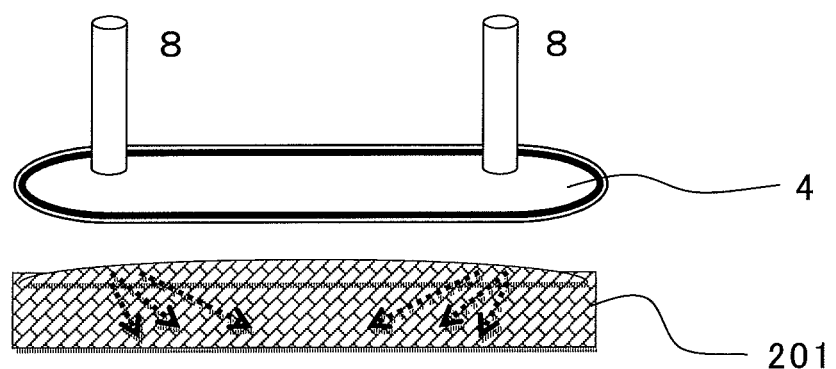
FIG. 2 is a schematic sectional view of a polishing head of a CMP apparatus according to a second embodiment of the present invention.
Figure 9:
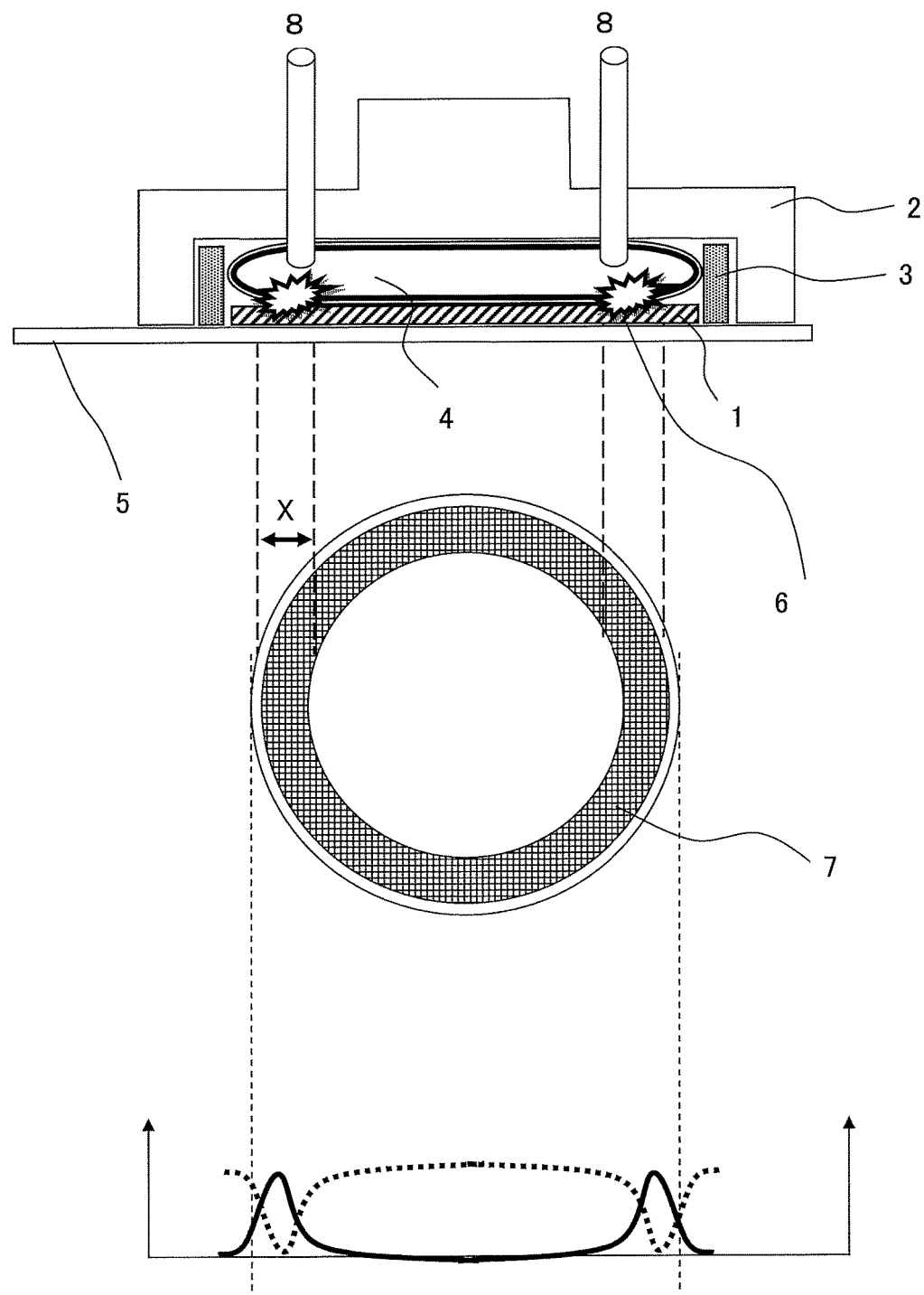
FIG. 9 is a schematic diagram for illustrating remaining film fluctuations throughout a wafer plane after polishing with the CMP apparatus according to prior art.

FIG. 2 is a schematic sectional view for illustrating a second embodiment of the present invention. FIG. 2 is a simplified illustration of a CMP apparatus in which only the air bag 4 and a stress distributing plate 201 under the air bag 4 are illustrated, and a shock absorbing sheet and other components below the stress distributing plate 201 are omitted. First, a high pressure region 6 to which high air pressure is applied locally as illustrated in FIG. 9 is already known in prior art, which is a region where the increased rate of polishing the polishing target material lowers the uniformity of planarization. Locally high pressure applies to the region 6 because the pressure from the air bag 4 is high in a portion that is close to an air flow inlet/outlet and to the retainer ring 3.

While the stress distributing plate 101 of the first embodiment is structured so as to have a uniform thickness, the stress distributing plate 201 of the second embodiment illustrated in FIG. 2 is structured so as to gradually increase in thickness as a distance traveled from the air flow inlet/outlet toward the central portion of the wafer 1 grows, in order to transmit pressure (or stress) on the high pressure region 6 to components below the stress distributing plate 201 in a distributed manner. Though not shown, the stress distributing plate 201 is shaped in the same manner in the depth direction as well, which gives the stress distributing plate 201 in contact with the air bag 4 a top surface that has a convex spherical shape and that peaks in height at its center. A portion of the stress distributing plate 201 that is on the opposite side from the spherical surface and that is in contact with the shock absorbing sheet is a flat surface.

The stress distributing plate 201 structured as shown above is capable of transmitting pressure (or stress) from the air bag 4 after more uniform distribution to components below the stress distributing plate 201. To conduct a test polishing for each polishing target material and to check the film remaining after the polishing for thickness irregularities throughout the wafer plane are recommended in order to adjust the thickness of the stress distributing plate 201 to have an optimum thickness and shape. Arrows in the stress distributing plate 201 in FIG. 2 indicate how the pressure (or stress) is distributed. The following embodiments also use arrows to indicate the manner of distribution in the drawings.

Figure 3:
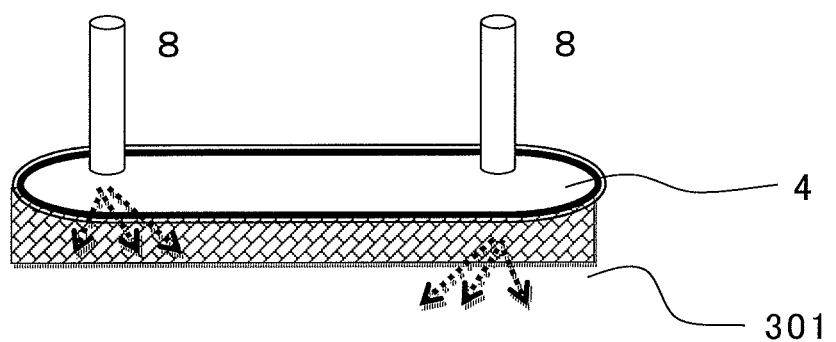
FIG. 3 is a schematic sectional view of a polishing head of a CMP apparatus according to a third embodiment of the present invention.

FIG. 3 is a schematic sectional view for illustrating a third embodiment of the present invention. While the stress distributing plate 101 of the first embodiment is structured so as to have a uniform thickness, a stress distributing plate 301 in FIG. 3 is structured so as to partially have a convex spherical shape that is a gentle curve only in a region directly under the air flow inlet/outlet and so as to be thicker in this region than in other regions of the stress distributing plate 301, in order to transmit pressure (or stress) on the high pressure region 6 to components below the stress distributing plate 301 in a distributed manner.

The stress distributing plate 301 structured as this is capable of transmitting pressure (or stress) from the air bag 4 in a further uniformly distributed manner to components below the stress distributing plate 301. It is recommended to conduct test polishing for each polishing target material and check the film remaining after the polishing for thickness irregularities throughout the wafer plane, in order to adjust the thickness of the partially provided convex spherical shape that is a gentle curve formed only in a region directly under the air flow inlet/outlet so that the stress distributing plate 301 has an optimum thickness and shape.

Figure 4:
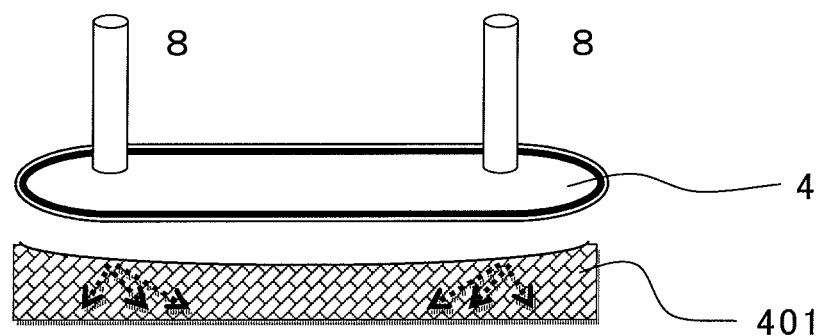
FIG. 4 is a schematic sectional view of a polishing head of a CMP apparatus according to a fourth embodiment of the present invention.

FIG. 4 is a schematic sectional view for illustrating a fourth embodiment of the present invention. While the stress distributing plate 101 of the first embodiment is structured so as to have a uniform thickness, a stress distributing plate 401 in FIG. 4 is structured so as to gradually decrease in thickness as a distance traveled from the air flow inlet/outlet toward the central portion of the wafer 1 grows, and so as to have a concave spherical shape that curves gently throughout the entire stress distributing plate 401 in a pattern that fits the shape of the air bag 4, in order to transmit pressure (or stress) on the high pressure region 6 to components below the stress distributing plate 401 in a distributed manner.

The stress distributing plate 401 structured as this is capable of transmitting pressure (or stress) from the air bag 4 in a further uniformly distributed manner to components below the stress distributing plate 401. It is recommended to conduct test polishing for each polishing target material and check the film remaining after the polishing for thickness irregularities throughout the wafer plane, in order to adjust the thickness of the stress distributing plate 401 so that the stress distributing plate 401 has an optimum thickness and shape.

Figure 5:
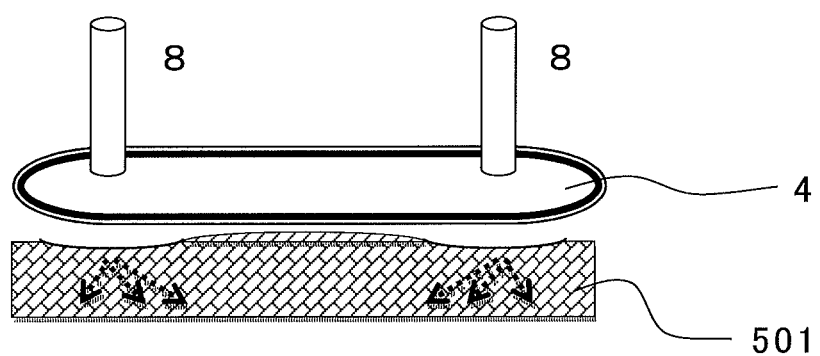
FIG. 5 is a schematic sectional view of a polishing head of a CMP apparatus according to a fifth embodiment of the present invention.

FIG. 5 is a schematic sectional view for illustrating a fifth embodiment of the present invention. While the stress distributing plate 101 of the first embodiment is structured so as to have a uniform thickness, a stress distributing plate 501 in FIG. 5 is structured so as to partially have a concave spherical shape that is a gentle curve only in a region directly under the air flow inlet/outlet and so as to be thinner in this region than in other regions of the stress distributing plate 501, in order to transmit pressure (or stress) on the high pressure region 6 to components below the stress distributing plate 501 in a distributed manner. A portion of the stress distributing plate 501 that is on the opposite side from the spherical surface and that is in contact with the shock absorbing sheet is a flat surface.

The stress distributing plate 501 structured as this is capable of transmitting pressure (or stress) from the air bag 4 in a further uniformly distributed manner to components below the stress distributing plate 501. It is recommended to conduct test polishing for each polishing target material and check the film remaining after the polishing for thickness irregularities throughout the wafer plane, in order to adjust the thickness of the partially provided concave spherical shape that is a gentle curve formed only in a region directly under the air flow inlet/outlet so that the stress distributing plate 501 has an optimum thickness and shape.

Figure 6:
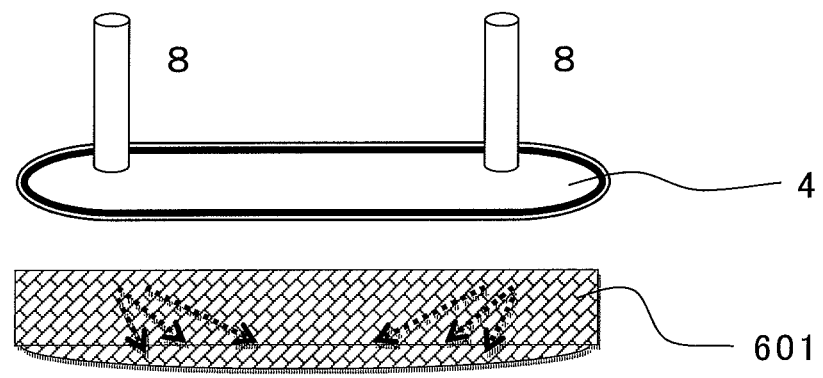
FIG. 6 is a schematic sectional view of a polishing head of a CMP apparatus according to a sixth embodiment of the present invention.

FIG. 6 is a schematic sectional view for illustrating a sixth embodiment of the present invention. While the stress distributing plate 101 of the first embodiment is structured so as to have a uniform thickness, a stress distributing plate 601 in FIG. 6 is structured so as to have a convex spherical shape that is obtained by turning the convex spherical shape of the second embodiment upside down and that slowly increases in thickness as a distance traveled from the air flow inlet/outlet toward the central portion of the wafer 1 grows, in order to transmit pressure (or stress) on the high pressure region 6 to components below the stress distributing plate 601 in a distributed manner.

In other words, the stress distributing plate 601 is structured so that the top surface in contact with the air bag 4 is a flat surface and so that the opposite bottom surface in contact with the shock absorbing sheet has a convex spherical shape. The stress distributing plate 601 structured as this is capable of transmitting pressure (or stress) from the air bag 4 in a further uniformly distributed manner to components below the stress distributing plate 601. It is recommended to conduct test polishing for each polishing target material and check the film remaining after the polishing for thickness irregularities throughout the wafer plane, in order to adjust the thickness of the central portion that has the shape of the stress distributing plate 601 as its feature so that the stress distributing plate 601 has an optimum thickness and shape.

Figure 7:
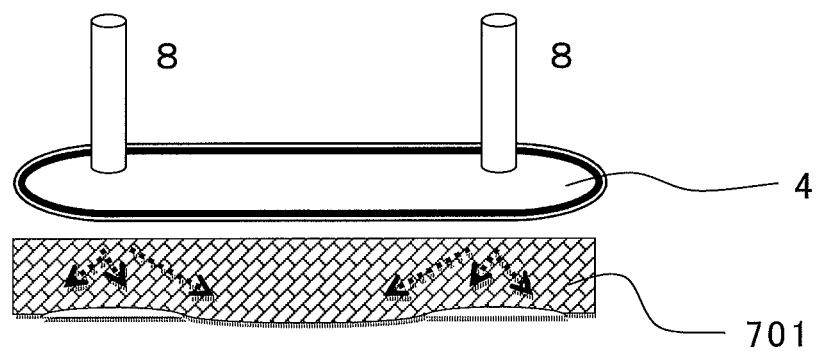
FIG. 7 is a schematic sectional view of a polishing head of a CMP apparatus according to a seventh embodiment of the present invention.
Figure 8:
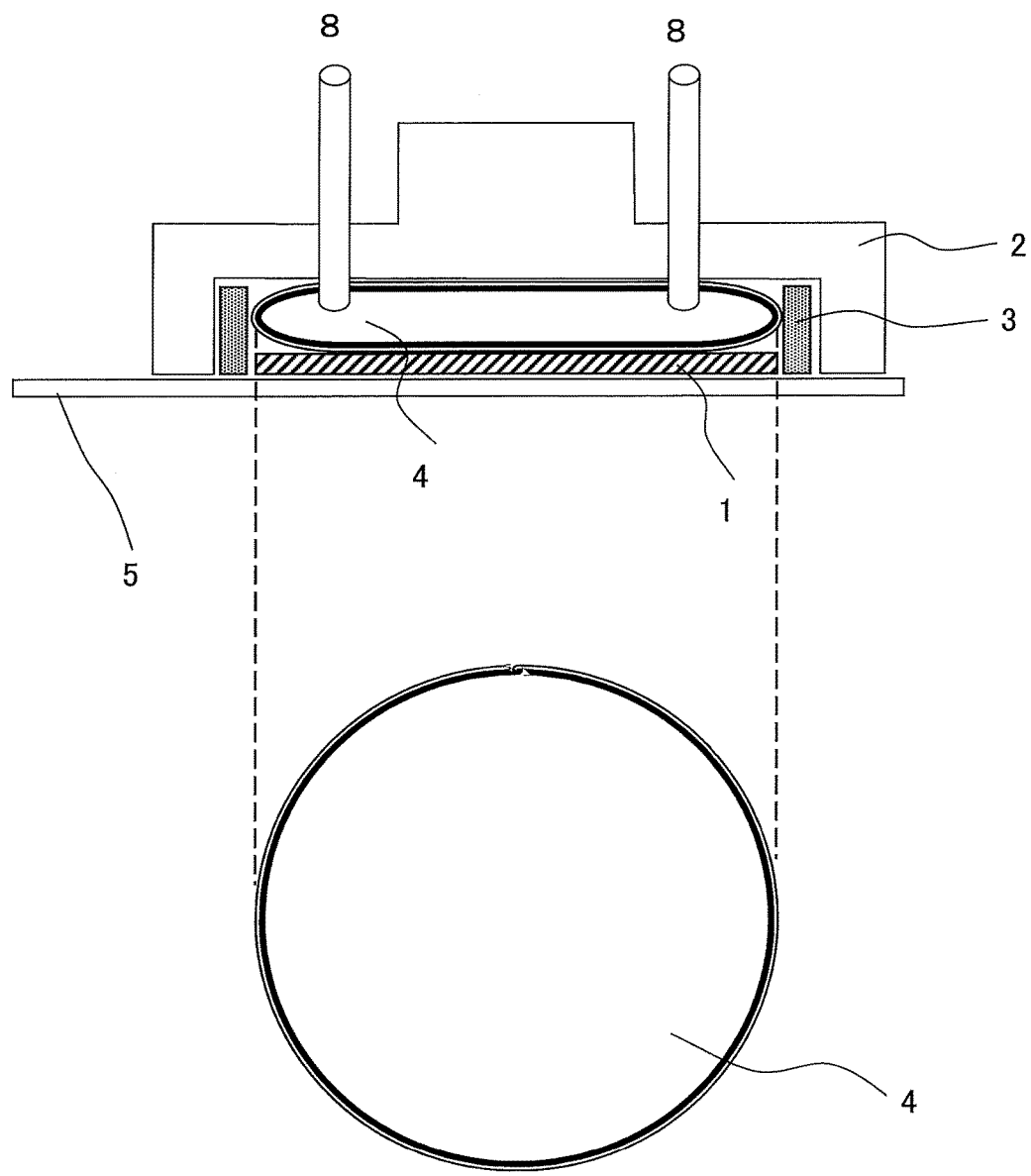
FIG. 8 is a schematic plan view and schematic sectional view of a polishing head of a CMP apparatus according to prior art.

FIG. 7 is a schematic sectional view for illustrating a seventh embodiment of the present invention. While the stress distributing plate 101 of the first embodiment is structured so as to have a uniform thickness, a stress distributing plate 701 in FIG. 7 is given a shape that is obtained by turning the stress distributing plate 501 of the fifth embodiment upside down, in order to transmit pressure (or stress) on the high pressure region 6 to components below the stress distributing plate 701 in a distributed manner. This enables the stress distributing plate 701 to transmit pressure (or stress) from the air bag 4 in a further uniformly distributed manner to components below the stress distributing plate 701.

It is recommended to conduct test polishing for each polishing target material and check the film remaining after the polishing for thickness irregularities throughout the wafer plane, in order to adjust the thickness of the partially provided concave spherical shape that is a gentle curve formed only in a region directly under the air flow inlet/outlet so that the stress distributing plate 701 has an optimum thickness and shape.

What is claimed is:

1. A polishing head for a CMP apparatus, comprising:
a polishing pad;
an air bag mounted on a surface of the polishing pad, and configured to press a front surface of a wafer against the polishing pad from a direction of a back surface of the wafer;
a retainer ring surrounding a side surface of the air bag;
atop ring enveloping the air bag, the wafer, and the retainer ring; and
a stress distributing plate and a shock absorbing sheet both provided between the air bag and the wafer.

2. A polishing head according to claim 1, wherein the stress distributing plate has a top surface that is in contact with the air bag and that has a spherical shape.

3. A polishing head according to claim 2, wherein the spherical shape comprises a convex spherical shape.

4. A polishing head according to claim 3, wherein the convex spherical shape is provided partially below an air flow inlet/outlet of the air bag.

5. A polishing head according to claim 2, wherein the spherical shape comprises a concave spherical shape.

6. A polishing head according to claim 5, wherein the concave spherical shape is provided partially below an air flow inlet/outlet of the air bag.

7. A polishing head according to claim 1, wherein the stress distributing plate has a bottom surface which is in contact with the shock absorbing sheet and that has a spherical shape.

8. A polishing head according to claim 7, wherein the spherical shape comprises a convex spherical shape.

9. A polishing head according to claim 7, wherein the spherical shape comprises a concave spherical shape.

10. A polishing head according to claim 9, wherein the concave spherical shape is provided partially below an air flow inlet/outlet of the air bag.

11. A polishing head according to claim 1, wherein the stress distributing plate is formed of one of a single metal film, a single ceramic film, and two or more composite films of metal and ceramic.

12. A polishing head according to claim 11, wherein the composite films comprise a layered member that is made of a plurality of materials different in Young's modulus, and a material that is relatively low in Young's modulus out of the plurality of materials is in contact with the air bag.

13. A CMP apparatus, comprising the polishing head of claim 1.

14. A semiconductor integrated circuit device manufacturing method, comprising planarizing a front surface of a wafer by using the CMP apparatus of claim 13.

* * * * *